US012683556B2

(12) United States Patent
Laur et al.

(10) Patent No.:  US 12,683,556 B2
(45) Date of Patent:      Jul. 14, 2026

(54) TEMPERATURE COMPENSATION OF SINGLE-ENDED DCR SENSING NETWORK IN MULTIPHASE SWITCHING POWER SUPPLIES

(71) Applicant: Alpha and Omega Semiconductor International LP, Toronto (CA)

(72) Inventors: Steven P. Laur, Raleigh, NC (US); Rhys Philbrick, Los Gatos, CA (US)

(73) Assignee: Alpha and Omega Semiconductor International LP, Toronto (CA)

( * ) Notice: Subject to any disclaimer, the term of this patent is extended or adjusted under 35 U.S.C. 154(b) by 455 days.

(21) Appl. No.: 18/508,254

(22) Filed: Nov. 14, 2023

(65) Prior Publication Data

US 2025/0158576 A1      May 15, 2025

(51) Int. Cl.
*H03F 1/30*          (2006.01)
*H03F 1/56*          (2006.01)
*H03F 3/45*          (2006.01)

(52) U.S. Cl.
CPC ............. *H03F 1/301* (2013.01); *H03F 1/565* (2013.01); *H03F 3/45475* (2013.01); *H03F 2200/261* (2013.01)

(58) Field of Classification Search
CPC ...... H03F 1/301; H03F 1/565; H03F 3/45475; H03F 2200/261
USPC ....................................................... 330/277
See application file for complete search history.

(56) References Cited

U.S. PATENT DOCUMENTS

| | | | |
|---|---|---|---|
| 10,795,390 B1 | 10/2020 | Philbrick et al. | |
| 2003/0107358 A1* | 6/2003 | Isham ................... | H02M 3/156 |
| | | | 323/283 |
| 2007/0257650 A1* | 11/2007 | Southwell .......... | H02M 3/1584 |
| | | | 323/283 |
| 2021/0344310 A1* | 11/2021 | Zanbaghi .............. | H03F 3/2173 |
| 2022/0345126 A1* | 10/2022 | Harriman .............. | H02M 3/158 |

(Continued)

OTHER PUBLICATIONS

Rahul et al.,"A Wide Dynamic-Range Low-Power Signal Conditioning Circuit for Low-Side Current Sensing Application", 2015 28th International Conference on VLSI Design and 2015 14th International Conference on Embedded Systems (Year: 2015).*

(Continued)

*Primary Examiner* — Hafizur Rahman

(57)                ABSTRACT

A circuit for providing temperature compensation to sense signals in a single-ended DC resistance (DCR) sensing network for a multiphase switching power supply includes a temperature compensation calculator circuit generating a compensation adjust signal indicative of a sensed temperature; a compensating impedance network receiving the positive sense signals for all the phases and generating a correction signal for each phase in response to at least the positive sense signal for each phase and the compensation adjust signal; an average circuit coupled to average the correction signals of all phases, where copies of the average correction signal are applied to modify the positive sense signals; and an amplifier circuit receiving a summed positive sense signal being the sum of the modified positive sense signals for all the phases and a summed negative sense signal to generate an output signal having substantially zero temperature coefficient over the first frequency range.

20 Claims, 8 Drawing Sheets

(56) References Cited

U.S. PATENT DOCUMENTS

2023/0353063 A1* 11/2023 Simionescu ........ H02M 3/1584

OTHER PUBLICATIONS

Richteck, Multi-Phase PWM Controller for CPU Core Power Supply, DS3607CE-04, Richtek Technology Corporation, www.richtek.com, Aug. 2018, 70 pgs.
Renesas, Smart Power Stage (SPS) Module with Integrated High Accuracy Current and Temperature Monitors, FN8684, Oct. 2, 2017, 17 pgs.
Renesas, Multiphase PWM Regulator for IMVP-6.5™ Mobile CPUs and GPUs, FN6890, Jun. 21, 2011, 41 pgs.
Analog Devices, Switch Mode Power Supply Current Sensing—Part 3: Current Sensing Methods, 2018, 4 pgs.
Richtek, Comparison of DCR Current Sense Topologies, AN-037, Richtek Technology Corporation, Oct. 2015, 14 pgs.
Texas Instruments, TPS65311-Q1 BUCK1 Controller DCR Current Sensing, SLVA791, Sep. 2016, 9 pgs.

* cited by examiner

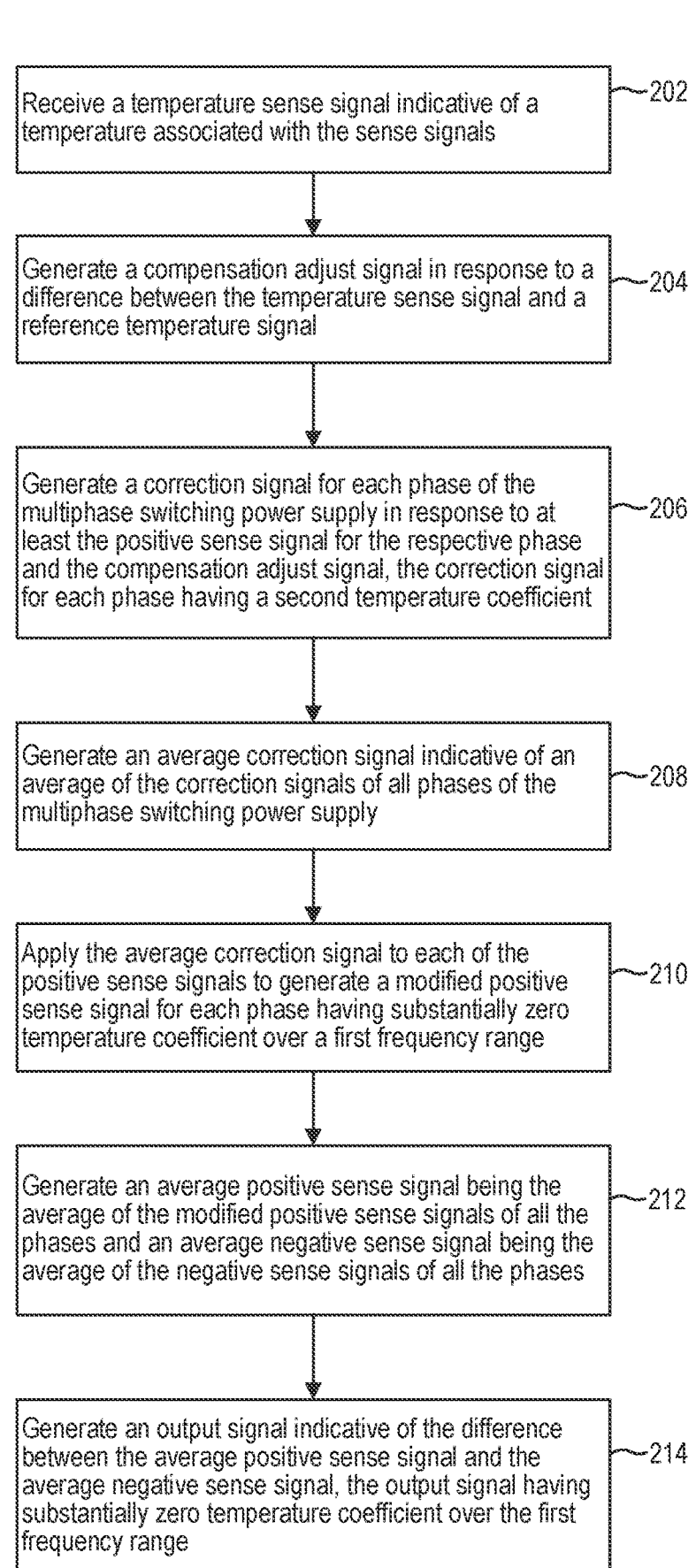

Receive a temperature sense signal indicative of a temperature associated with the sense signals ~202

Generate a compensation adjust signal in response to a difference between the temperature sense signal and a reference temperature signal ~204

Generate a correction signal for each phase of the multiphase switching power supply in response to at least the positive sense signal for the respective phase and the compensation adjust signal, the correction signal for each phase having a second temperature coefficient ~206

Generate an average correction signal indicative of an average of the correction signals of all phases of the multiphase switching power supply ~208

Apply the average correction signal to each of the positive sense signals to generate a modified positive sense signal for each phase having substantially zero temperature coefficient over a first frequency range ~210

Generate an average positive sense signal being the average of the modified positive sense signals of all the phases and an average negative sense signal being the average of the negative sense signals of all the phases ~212

Generate an output signal indicative of the difference between the average positive sense signal and the average negative sense signal, the output signal having substantially zero temperature coefficient over the first frequency range ~214

Fig. 8

TEMPERATURE COMPENSATION OF SINGLE-ENDED DCR SENSING NETWORK IN MULTIPHASE SWITCHING POWER SUPPLIES

FIELD OF THE INVENTION

The invention relates to circuits and methods for providing temperature compensation of a sense signal and, in particular, to a circuit and method applying temperature compensation of single-ended DCR sensing network in multiphase switching power supplies.

BACKGROUND OF THE INVENTION

Electronic systems, such as laptop computers, typically include power management integrated circuits for regulating the power usage of the electronic systems. Furthermore, electronic systems incorporating integrated circuits typically employ voltage regulators to convert a main bus voltage from a power source supplying the system to one or more voltages necessary for driving the integrated circuits therein. For example, a 5 volts supply voltage provided to an electronic system may need to be reduced to 1.8 volts to drive an integrated circuit in the electronic system. Embedded systems, such as Internet of Things (IoT) devices, include processors (or microcontrollers) and local memory coupled to components and executing embedded software to perform certain tasks. In practice, the processor power supply is provided by a voltage regulator converting an input voltage from a power source to a voltage value specified for the processor.

Switch mode power supplies or switching regulators, also referred to as DC to DC converters, are a type of voltage regulators often used to convert an input supply voltage to a desired output voltage at a voltage level selected for an integrated circuit. In one example, a 12V or 5V supply voltage may be reduced to 1V for supplying an embedded processor. A switching regulator provides power supply function through low loss components such as capacitors, inductors, and transformers, and power switches that are turned on and off to transfer energy from the input to the output in discrete packets. A feedback control circuit is used to regulate the energy transfer to maintain a constant output voltage within the desired load limits of the circuit.

Some switching regulators employ pulse width modulation (PWM) to control the duty cycle of the power switches. That is, the on-time of power switches may be controlled at a given fixed or variable frequency by adjusting the pulse width. Switching regulators employing PWM control include a PWM controller or modulator to drive a power block including the power switches, the driver circuit for the power switches and the LC filter circuit. In some cases, the switching regulator is a single phase converter and the PWM controller generates a single phase PWM clock signal to drive a single phase power block. In other cases, the switching regulator is a multiphase converter or multiphase switching power supply and a multiphase PWM controller generates clock signals with different phase shifts to drive a multiphase power block, each clock signal driving a respective power block cell. Multiphase PWM controllers are desirable when the voltage regulator has to deliver a regulated output voltage with high precision over a wide range of load conditions.

In an electronic system incorporating a voltage regulator, it is often necessary to measure the output current of the voltage regulator to implement power management functions. In a multiphase converter, accurate output current sensing is also important in multiphase switching power supplies for output voltage load-line control and phase-to-phase current balance. For instance, the load current at each power block is measured to determine the load balancing between the power blocks.

SUMMARY OF THE INVENTION

The present disclosure discloses a temperature compensation circuit, substantially as shown in and/or described below, for example in connection with at least one of the figures, as set forth more completely in the claims.

In some embodiments, a circuit for providing temperature compensation to sense signals in a single-ended DC resistance (DCR) sensing network for a multiphase switching power supply, where an inductor current in each phase of the multiphase switching power supply is sensed by a resistor-capacitor (RC) network connected in parallel to the inductor of the respective phase and a voltage across the capacitor of the RC network is provided as sense signals indicative of the inductor current, the sense signals including a positive sense signal and a negative sense signal and having a first temperature coefficient. The circuit includes a temperature compensation calculator circuit receiving a temperature sense signal indicative of a temperature associated with the sense signals and a reference temperature signal and generating a compensation adjust signal in response to a difference between the temperature sense signal and the reference temperature signal; a compensating impedance network receiving the positive sense signals for all the phases of the multiphase switching power supply, a summed negative sense signal being the sum of the negative sense signals of all the phases of the multiphase switching power supply and the compensation adjust signal, the compensating impedance network generating a correction signal for each phase of the multiphase switching power supply in response to at least the positive sense signal for each phase and the compensation adjust signal, the correction signal for each phase having a second temperature coefficient; an average circuit coupled to average the correction signals associated with all the phases of the multiphase switching power supply to generate an average correction signal, the average correction signal or copies of the average correction signal being applied to modify each of the positive sense signals to provide a modified positive sense signal for each phase having substantially zero temperature coefficient over a first frequency range; and an amplifier circuit receiving a summed positive sense signal being the sum of the modified positive sense signals for all the phases and the summed negative sense signal, the amplifier circuit generating an output signal indicative of the difference between the summed positive sense signal and the summed negative sense signal, the output signal having substantially zero temperature coefficient over the first frequency range.

In some embodiments, a method provides temperature compensation to sense signals in a single-ended DC resistance (DCR) sensing network for a multiphase switching power supply, where an inductor current in each phase of the multiphase switching power supply is sensed by a resistor-capacitor (RC) network connected in parallel to the inductor of the respective phase. A voltage across the capacitor of the RC network is provided as sense signals indicative of the inductor current, where the sense signals include a positive sense signal and a negative sense signal and having a first temperature coefficient. The method includes: receiving a temperature sense signal indicative of a temperature associated with the sense signals; generating a compensation adjust signal in response to a difference between the temperature sense signal and a reference temperature signal; generating a correction signal for each phase of the multiphase switching power supply in response to at least the positive sense signal for the respective phase and the compensation adjust signal, the correction signal for each phase having a second temperature coefficient; generating an average correction signal indicative of an average of the correction signals of all phases of the multiphase switching power supply; applying the average correction signal to each of the positive sense signals to generate a modified positive sense signal for each phase having substantially zero temperature coefficient over a first frequency range; generating a summed positive sense signal being the sum of the modified positive sense signals of all the phases and a summed negative sense signal being the sum of the negative sense signals of all the phases of the multiphase switching power supply; and generating an output signal indicative of the difference between the summed positive sense signal and the summed negative sense signal, the output signal having substantially zero temperature coefficient over the first frequency range.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 8 is a flowchart illustrating a method of providing temperature compensation to sense signals in a single-ended DC resistance (DCR) sensing network for a multiphase switching power supply in some embodiments.

4

DETAILED DESCRIPTION OF THE INVENTION

Figure 1:
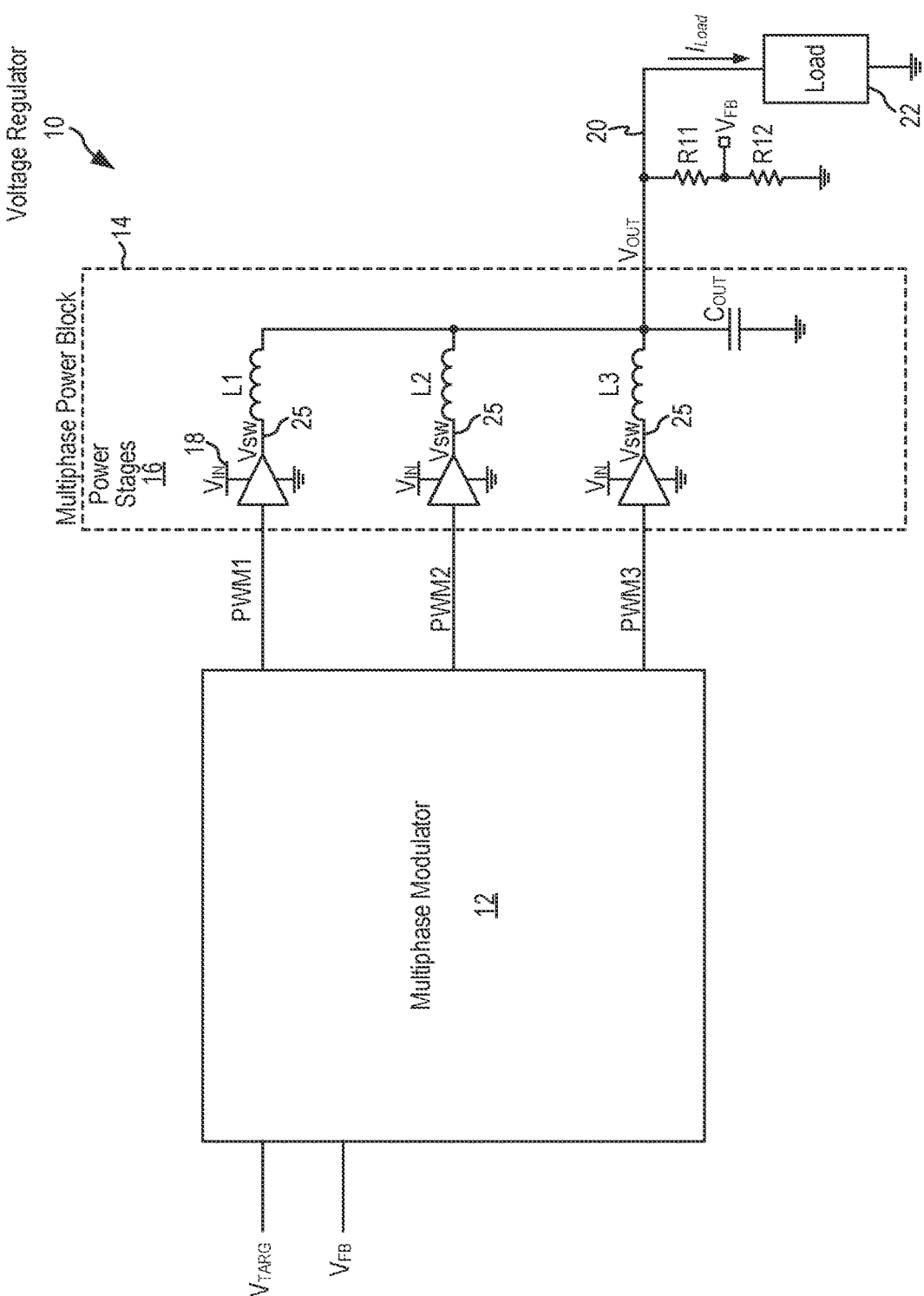
FIG. 1 is a schematic diagram of a voltage regulator incorporating a multiphase current mode modulator in some examples.

According to embodiments of the present invention, a temperature compensation circuit provides temperature compensation to sense signals in a single-ended DC resistance (DCR) sensing network implemented for a multiphase switching power supply where the sense signals measure the inductor current in each phase of the multiphase switching power supply. The sense signals generated from the DCR sensing network have a first temperature coefficient and the temperature compensation circuit generates compensation adjust signal in response to a temperature difference to provide correction signals to the sense signals where the correction signals have a second temperature coefficient. The correction signals are applied to modify the sense signals to provide modified sense signals having substantially zero temperature coefficient over a given frequency range. The modified sense signals can then be averaged and applied as single-ended signals to generate an output signal indicative of an average inductor current of the multiphase switching power supply where the output signal has substantially zero temperature coefficient over the given frequency range.

In some embodiments, the temperature compensation circuit is incorporated in the PWM controller integrated circuit for the multiphase switching power supply and is coupled to sense an output current of a voltage regulator. In some cases, an inductor DC resistance (DCR) sensing scheme is used to sense the inductor current at each phase of the multiphase switching power supply as indicative of the output current of the voltage regulator. The current sense signal resulted from the inductor DCR sensing often has a temperature coefficient. The temperature compensation circuit of the present disclosure is incorporated in the controller integrated circuit to generate a correction signal which is used to modify the current sense signal to provide a modified current sense signal with substantially zero temperature coefficient. The controller integrated circuit uses the modified current sense signal to generate an output signal indicative of the output current of the voltage regulator where the output signal has substantially zero temperature coefficient over a given frequency range.

A salient feature of the temperature compensation circuit of the present disclosure is that the circuit provides accurate temperature compensation over a wide frequency range. In conventional solutions, the temperature compensation is often accurate only for DC signals and the temperature compensation becomes inaccurate when the sense signal changes at a given frequency. In embodiments of the present disclosure, the temperature compensation circuit provides accurate temperature compensation at DC (0 Hz) and also at high frequency, such as several MHz. In one embodiment, the temperature compensation circuit provides accurate temperature compensation over a frequency range from DC to 10 MHz, representing a marked improvement over conventional solutions.

In the present disclosure, the term "temperature coefficient" refers to the relative change in a signal's physical property that is associated with a given change in temperature. In particular, temperature coefficient describes that rate of change of the physical property relative to a given change in temperature. Typically, a positive temperature coefficient refers to a property that increases with increasing temperature and a negative temperature coefficient refers to a property that decreases with increasing temperature. A property or a signal that does not vary much with temperature is described as having a zero or substantially zero temperature coefficient. For instance, in the present description, a sense signal is described as having a positive temperature coefficient. That is, the sense signal's sensed value (voltage or current) increases with temperature. A temperature compensated sense signal should have a zero or substantially zero temperature coefficient. That is, a temperature compensated sense signal senses a current or voltage value that does not vary with changes in temperature.

In general, a temperature coefficient can be linear or non-linear in nature. In some examples of the present disclosure, a temperature coefficient is expressed as a function having a slope and an offset. For example, a temperature coefficient may have a positive temperature coefficient with a positive slope and a given offset. In another example, a temperature coefficient may have a negative temperature coefficient with a negative slope and a given offset.

FIG. 1 is a schematic diagram of a voltage regulator incorporating a multiphase current mode modulator in some examples. Referring to FIG. 1, a voltage regulator 10 includes a multiphase modulator 12 ("modulator 12") coupled to drive a multiphase power block 14. In the present example, the voltage regulator 10 is implemented using a multiphase modulator to enable the voltage regulator to deliver a regulated output voltage with high precision over a wide range of load conditions. The use of a multiphase modulator is illustrative only and not intended to be limiting. In other examples, the voltage regulator can be implemented using a single phase modulator driving a single phase power block. In the present example, the multiphase modulator 12 includes three phases and the power block 14 includes three power stages 20 with associated output inductors L1 to L3 and an output capacitor $C_{OUT}$.

More specifically, the voltage regulator 10 receives an input voltage VIN on an input node 18 and generates a regulated output voltage $V_{OUT}$ on an output node 20 to supply a load 22. The multiphase power block 14 includes power stages 16 driven by respective PWM signals PWM1 to PWM3. Each power stage 16 includes a pair of power switches which are turned on and off by the respective PWM signal to regulate the output voltage $V_{OUT}$ with reference to a target voltage. The power switches in each power stage 16 are alternately turned on and off to generate a switching output voltage $V_{SW}$ at a switching output node 25. The switching output node for each power stage 16 is coupled to respective output inductor L1 to L3. The inductors L1 to L3 are coupled to the output capacitor $C_{OUT}$ to form an LC circuit for providing current to the output node 20 while maintaining a substantially constant output voltage $V_{OUT}$. The output voltage $V_{OUT}$ can then be used to drive the load 22.

The multiphase modulator 12 receives a feedback voltage $V_{FB}$ indicative of the regulated output voltage $V_{OUT}$ on output node 20. In one example, the feedback voltage $V_{FB}$ is a stepped down voltage of the output voltage $V_{OUT}$. For example, the feedback voltage $V_{FB}$ can be generated using a resistor divider including resistors R11 and R12 coupled to the output voltage node 20. The multiphase modulator 12 also receives a target voltage $V_{TARG}$ indicative of the voltage value desired for the regulated output voltage. In some examples, the target voltage may be indicated by a voltage identification code signaling the desired regulator output voltage. For instance, when applied in mobile voltage positioning, the modulator 12 may receive a voltage identification (VID) code that tells the modulator what output voltage value it should provide. Each VID code is associated with a voltage value. A decoder decodes the VID code to generate the target voltage. The modulator 12 includes circuitry to implement the feedback control loop of the voltage regulator to generate the multiphase PWM signals PWM1 to PWM3 to drive the respective power stages 16 in the multiphase power block 14.

As thus configured, the voltage regulator 10 may be incorporated into an electronic system to provide the desired regulated output voltage $V_{OUT}$ to the electronic system. In some applications, the electronic system includes power integrated circuits that perform power management functions and the power integrated circuit often needs to accurately measure the output current or the load current of the voltage regulator 10. In other examples, the multiphase modulator itself incorporates circuitry for current sensing and power measurement. In some examples, the output current of the voltage regulator 10 is measured by measuring the current flow through the inductor L. In the case of a multiphase voltage regulator, the inductor current through the inductor in each phase may be measured to derive the output current or the load current being provided by the voltage regulator. In some examples, the inductor current is measured using an inductor DC resistance (DCR) current sensing scheme.

Figure 2:
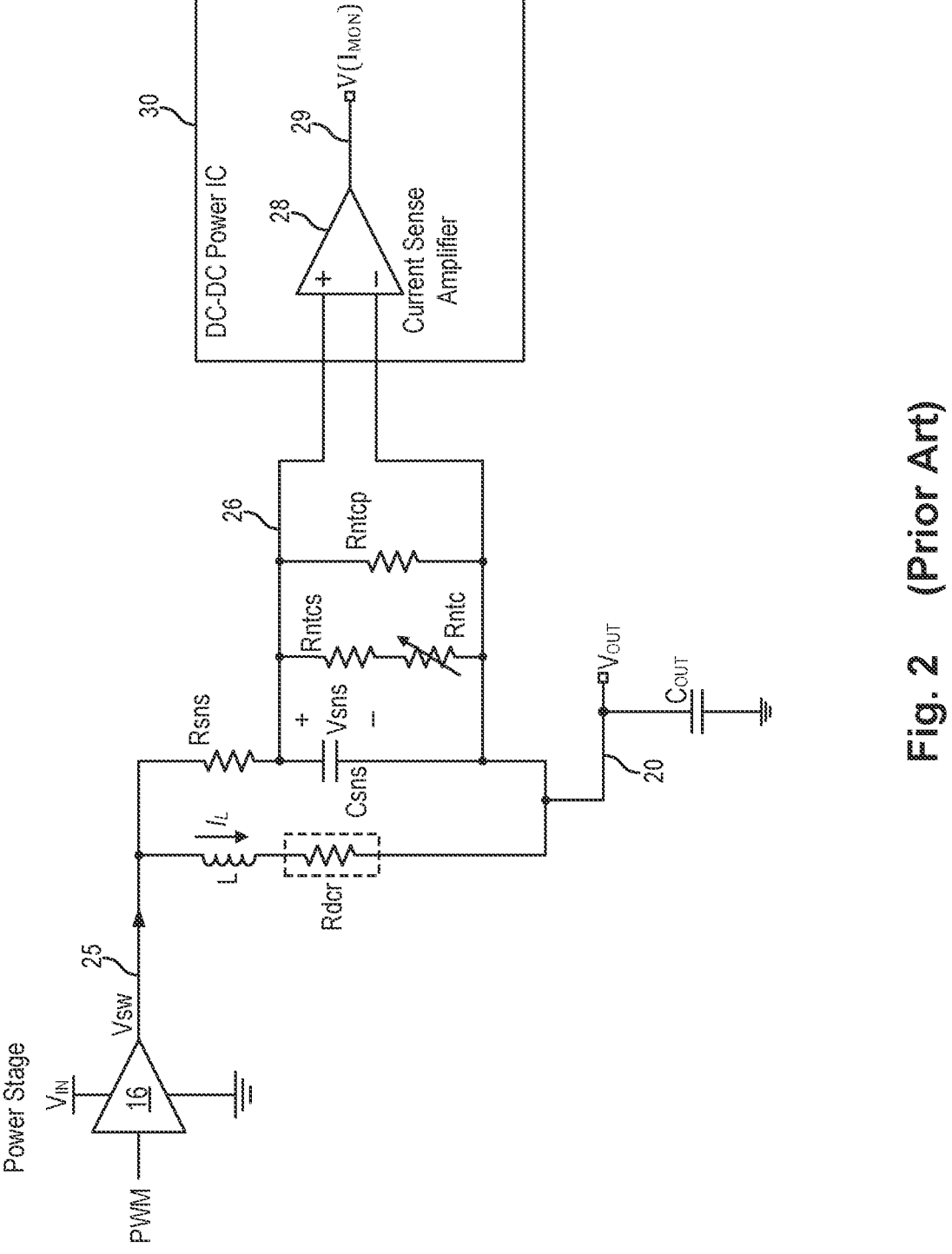
FIG. 2 is a circuit diagram illustrating implementation of the DCR current sensing for a voltage regulator in some examples.

FIG. 2 is a circuit diagram illustrating implementation of the DCR current sensing for a voltage regulator in some examples. Referring to FIG. 2, DCR current sensing is applied to measure the current flow at the output inductor L of a voltage regulator. The voltage regulator includes the power stage 16, formed by power MOSFET devices, generating a switching output voltage $V_{SW}$ (node 25) which is coupled to drive the inductor L connected between the switching output node 25 and the output node 20 of the voltage regulator providing the output voltage $V_{OUT}$. The output capacitor $C_{OUT}$ is coupled between the output node 20 and the ground potential to generate the output voltage $V_{OUT}$ having substantially constant magnitude.

In many applications, inductor DC resistance (DCR) current sensing is applied to sense the output current of the voltage regulator. In particular, inductor DCR current sensing refers to measuring the regulator output current using the parasitic resistance of the inductor winding, thereby eliminating the need to include a sense resistor in series with the inductor L. The parasitic resistance of the inductor L is denoted as a resistor Rdcr in FIG. 2 where the dotted line box indicates the resistor is a parasitic component, not an actual resistor in the circuit. DCR current sensing uses a resistor-capacitor (RC) network placed in parallel with the series inductor and parasitic resistance combination L and Rdcr. In particular, the RC network includes a sense resistor Rsns and a sense capacitor Csns connected in series across the inductor L, that is, across nodes 25 and 20. The sense voltage Vsns is measured across the sense capacitor Csns between node 26 and node 20. With proper selection of component values for the resistor Rsns and capacitor Csns, the voltage across the capacitor Csns can be made proportional to the inductor current. More specifically, when the RC time constant of the RC network is equal to the ratio of the inductance (L) and series resistance (Rdcr) of the inductor L, the voltage across the sense capacitor Csns will be directly proportional to the inductor current IL, as given by the equation: Rsns*Csns=L/Rdcr. To sense the capacitor voltage Vsns, Kelvin sensing is used to sense a pair of differential sense signals: a positive sense signal and a negative sense signal.

Inductor DCR of the wire winding varies with temperature. The temperature coefficient of the inductor DCR results in the sensed voltage Vsns having a temperature coefficient.

More specifically, the inductor DCR typically has a positive temperature coefficient. That is, the resistance Rdcr increases with temperature increase. The sensed voltage Vsns thus also has a positive temperature coefficient. For high accuracy current sensing, inductor DCR current sensing has to be temperature compensated to match the measurement shift caused by the temperature coefficient of the DCR. In some examples, a linearized NTC (negative temperature coefficient) resistor network is used to provide temperature compensation, as shown in FIG. 2.

More specifically, the linearized NTC resistor network includes a serial combination of a resistor Rntcs and a resistor Rntc, which is connected in parallel with a resistor Rntcp. The linearized NTC resistor network is connected between the sense voltage node 26 and the output node 20. The resistor Rntc provides a resistance that varies with temperature. In particular, the resistor Rntc has a negative temperature coefficient (NTC). The linearized NTC resistor network operates to counter the temperature coefficient of the sense voltage Vsns, which is caused by the temperature coefficient of the DCR of the inductor. The temperature compensated sense voltage (between node 26 and node 20) is then measured by a current sense amplifier 28 which may be formed as part of a power integrated circuit 30 or as part of the modulator or controller for the voltage regulator. The current sense amplifier 28 generates an output signal on an output node 29 indicative of the current sense value. In one example, the current sense amplifier 28 generates a voltage signal V (Imon) indicative of the current sense value. In other examples, the current sense amplifier 28 generates a current signal Imon indicative of the current sense value.

In particular, the inductor DCR, that is resistor Rdcr, has a positive and linear temperature coefficient. The resistor Rntc provides a negative temperature coefficient to compensate for the positive temperature coefficient of the inductor DCR. However, the negative temperature coefficient of resistor Rntc has an exponential behavior. Therefore, resistors Rntcs and Rntcp are used to linearize the exponential behavior of resistors Rntc. In operation, the linearized NTC resistor network provides temperature compensation that matches the temperature coefficient of the inductor DCR, denoted as resistance Rdcr.

In practice, because the resistor Rntc is often not placed at or near the inductor L on the PC board of the electronic system. The resistor Rntc cannot sense the same temperature experienced by the inductor L. Therefore, the linearized NTC network needs to be specifically designed for each inductor in each new board design. The linearized NTC resistor network needs to be tuned so that the sense network accurately senses the current over a wide frequency range, such as from DC to ~10 MHz. The tuning process is iterative and each iteration requires re-soldering the NTC resistor network and measuring the current sense accuracy over frequency and temperature. The iterative process is carried out to determine a set of the resistance values of the resistors in the NTC resistor network that can be used for temperature compensation for a particular PC board design. The iterative process must be carried out for each PC board design to determine the optimal values for the NTC resistor network. Furthermore, for multiphase converters, separate linearized NTC resistor network is built and tuned for each inductor of the multi-phase power block.

Figure 3:
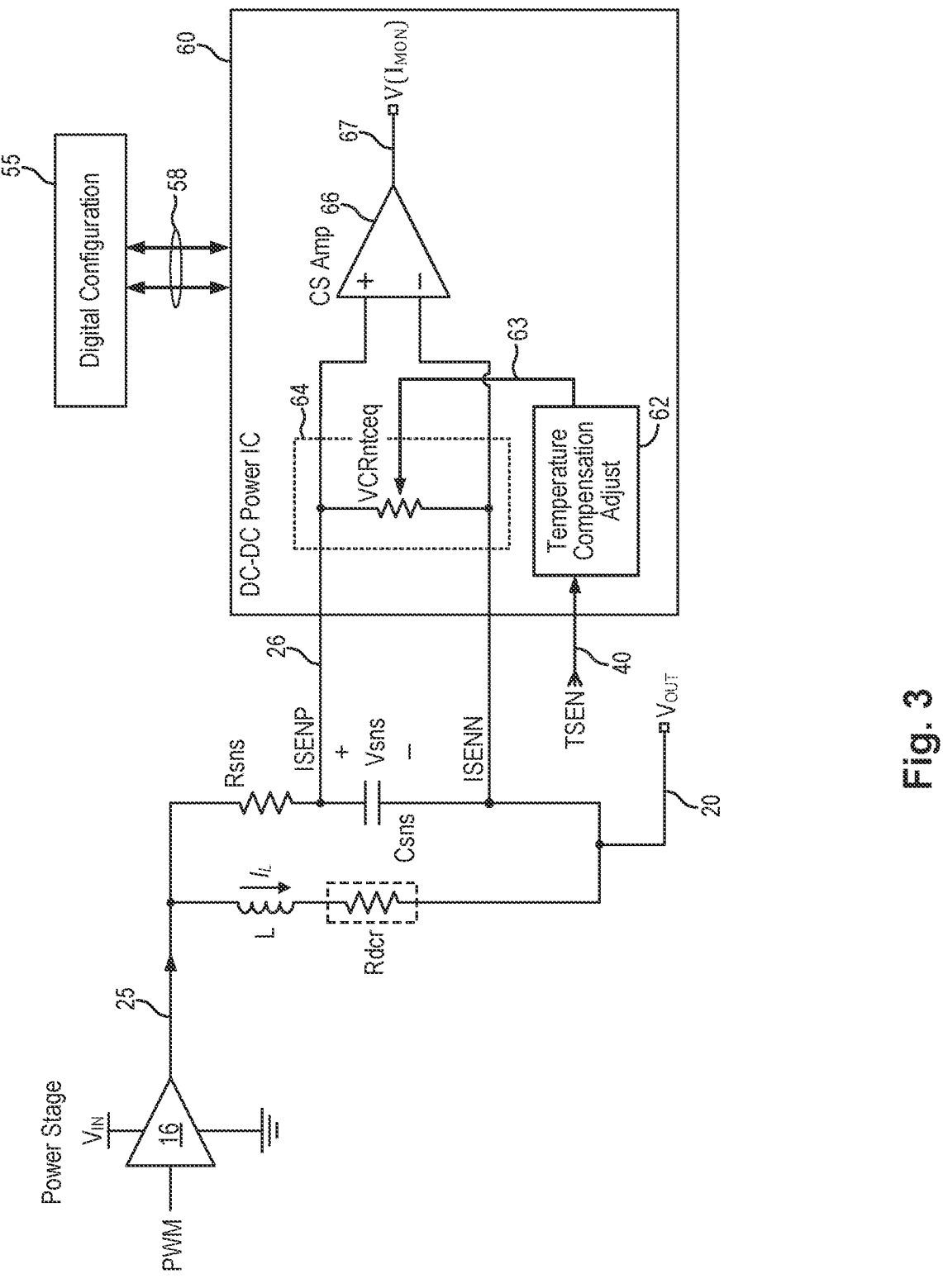
FIG. 3 duplicates FIG. 5 of the '390 patent and illustrates one exemplary implementation of the temperature compensation scheme described in U.S. Pat. No. 10,795,390.

U.S. Pat. No. 10,795,390, issued Oct. 6, 2020, describes a temperature compensation scheme for inductor DCR current sensing to generate a current sense signal has substantially zero temperature coefficient over a wide frequency range. The '390 patent is hereby incorporated by reference in its entirety. FIG. 3 duplicates FIG. 5 of the '390 patent and illustrates one exemplary implementation of the temperature compensation scheme described in the '390 patent. Referring to FIG. 3, a power integrated circuit 60 includes a current sense amplifier 66 for measuring a sense voltage Vsns across the sense capacitor Csns indicative of the inductor current IL flowing through the inductor L. The current sense amplifier 66 generates an output signal on node 67 being a voltage signal V (Imon) indicative of the sense voltage and thus indicative of the inductor current IL. In embodiments of the present disclosure, the power integrated circuit 60 incorporates a temperature compensation circuit to provide temperature compensation for the sense voltage Vsns which has a first temperature coefficient.

In the present embodiment, the temperature compensation circuit includes a temperature compensation adjust circuit 62 and a voltage controlled resistor VCRntceq as the compensating impedance circuit 64. The temperature compensation adjust circuit 62 receives a temperature sense signal TSEN (node 40) and provides a control signal (node 63) to the voltage controlled resistor VCRntceq. In the present embodiment, the control signal is a control voltage signal. The voltage controlled resistor VCRntceq provides a resistance value that varies in response to a control voltage. In particular, the voltage controlled resistor VCRntceq provides a compensating impedance signal in response to the control voltage signal where the compensating impedance signal has a second temperature coefficient and has an impedance value indicative of the temperature sense signal TSEN. In some embodiments, the temperature compensation adjust circuit 62 is digitally configured to generate the control signal which compensates for the first temperature coefficient of the sense voltage. For instance, the temperature compensation adjust circuit 62 may be digitally configured or programmed by the digital configuration circuit 55 using one or more digital signals 58.

Accordingly, the temperature compensation adjust circuit 62 generates the control voltage so that the voltage controlled resistor VCRntceq provides resistance values that vary with the sensed temperature and also having a temperature coefficient that compensates for the temperature coefficient of the sense voltage Vsns. In other words, the temperature compensation adjust circuit 62 generate the control signal to set the resistance value of the voltage controlled resistor VCRntceq and to control how the resistance value of resistor VCRntceq changes with temperature. As thus configured, the resistor VCRntceq applies the compensating impedance signal to node 26 to modify the sense voltage Vsns so that the modified or temperature compensated sense voltage has zero or substantially zero temperature coefficient over a given frequency range. The current sense amplifier 66 receives the modified sense voltage and thus generates the output signal V (Imon) indicative of the sense voltage and having zero or substantially zero temperature coefficient over a given frequency range. The temperature compensation circuit of the present disclosure ensures that the power integrated circuit 60 can measure the inductor current accurately over a wide range of frequency and a wide range of temperature.

The inductor DCR sensing scheme described in FIGS. 2 and 3 employs Kelvin sensing to measure the sense voltage Vsns across the sense capacitor Csns. The voltage sense signal is therefore a differential sense signal including a positive sense signal (ISENP) and a negative sense signal (ISENN) that are coupled to the positive and negative input terminals of a current sense amplifier. In a multiphase switching power supply, full differential DCR sensing scheme requires two signal pins for each phase for implementation. For a multiphase switching power supply with a large number of phases (N), the differential DCR sensing scheme becomes costly to implement due to the large pin count and may be difficult to implement due to pin limitations on the integrated circuit package of the multiphase controller. For instance, in an N-phase voltage regulator, 2N number of pins are required to implement fully differential inductor DCR current sensing. In the case the voltage regulator has 12 to 16 phases, 24 to 32 pins are needed to implement fully differential inductor DCR current sensing.

Figure 4:
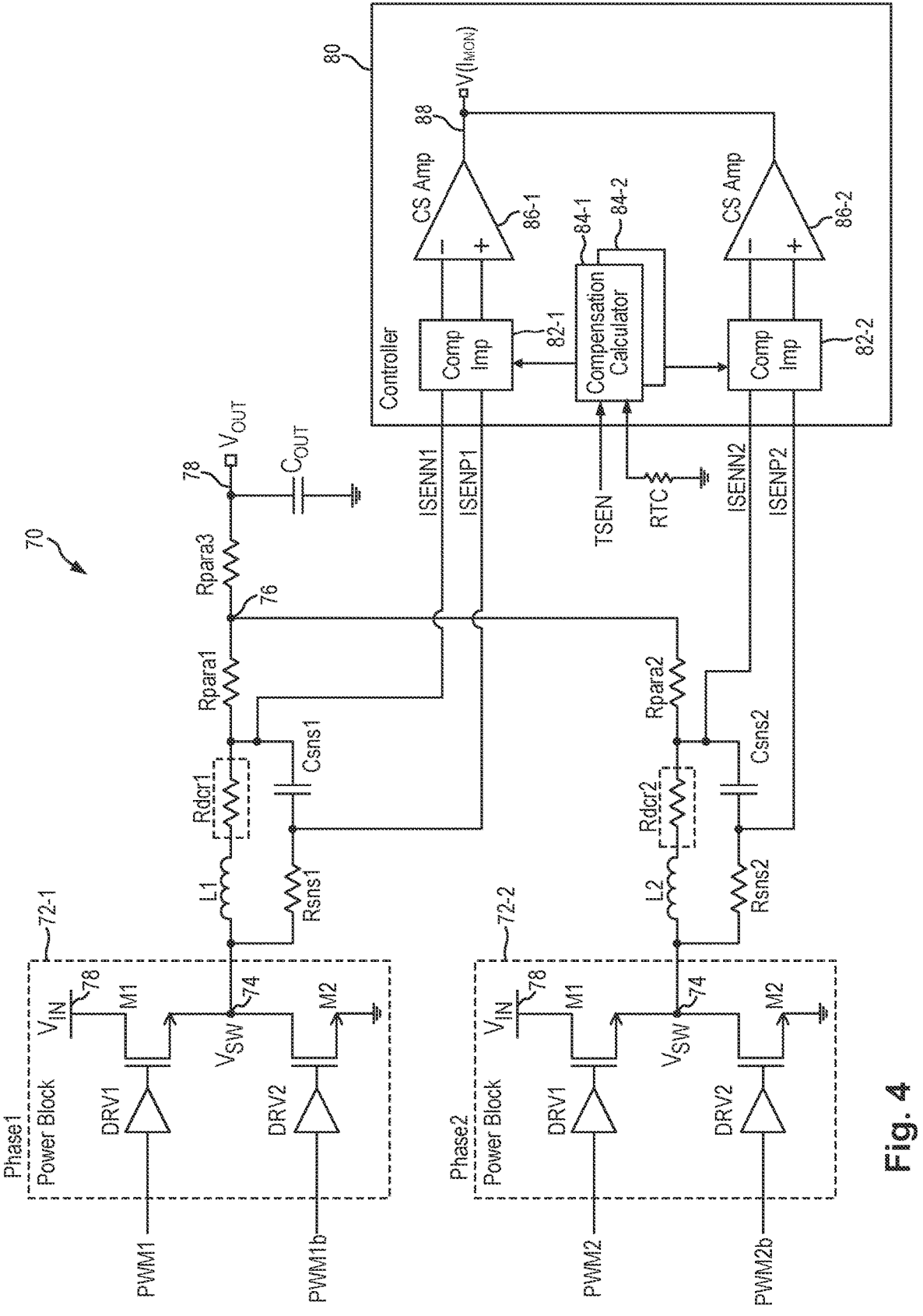
FIG. 4 illustrates an exemplary implementation of the temperature compensation scheme described in the '390 patent in a multiphase switching power supply in some examples.

FIG. 4 illustrates an exemplary implementation of the temperature compensation scheme described in the '390 patent in a multiphase switching power supply in some examples. In the example shown in FIG. 4, a multiphase switching power supply 70 is illustrated as having 2 phases—Phase 1 and Phase 2, with individual power blocks 71-2 and 72-2. Inductor DCR sensing is implemented by providing RC networks in parallel with the inductor in each phase. The inductor current of inductor L1 of Phase 1 is sensed by the capacitor voltage across the sense capacitor Csns1 using sense signals ISENP1 and ISENN1. The inductor current of inductor L2 of Phase 2 is sensed by the capacitor voltage across the sense capacitor Csns2 using sense signals ISENP2 and ISENN2. Accordingly, for the two phases, four signal pins are required to implement the current sensing. In the present example, the four sense signals are provided to a controller 80. Temperature compensation is applied to each pair of differential sense signals ISENPn/ISENNn (where "n" denotes a respective phase). For example, respective compensation calculators 84-1 and 84-2 are provided for each phase to generate the respective control signals for controlling the respective compensating impedance circuit 82-1 and 82-2. The compensated sense signals are then sensed by the current sense amplifiers 86-1 and 86-2. The output signal of the current sense amplifiers 86-1 and 86-2 may be summed to generate the output signal V (Imon) (node 88) indicative of the load current of the multiphase switching regulator 70.

To overcome the limitations of the differential DCR sensing scheme, single-ended DCR sensing has been developed to reduce the number of signal pins required to provide the current sense signal for a multiphase switching power supply. In one example, the negative sense signals across all phases are summed to generate a summed negative sense signal. The positive sense signals and the summed negative sense signal are then applied to perform current sensing. For an N-phase voltage regulator, the single-ended DCR sensing scheme can be implemented using only N+1 number of signal pins, as opposed to 2N signal pins in the case of the fully differential DCR sensing scheme. In embodiments of the present invention, a temperate compensation circuit is provided to implement temperature compensation for the single-ended DCR sensing network to ensure the current sense signal thus derived has substantially zero temperature coefficient over a wide frequency range. In some embodiments, the temperature compensation is implemented based on the temperature compensation schemes described in the aforementioned '390 patent.

Figure 5:
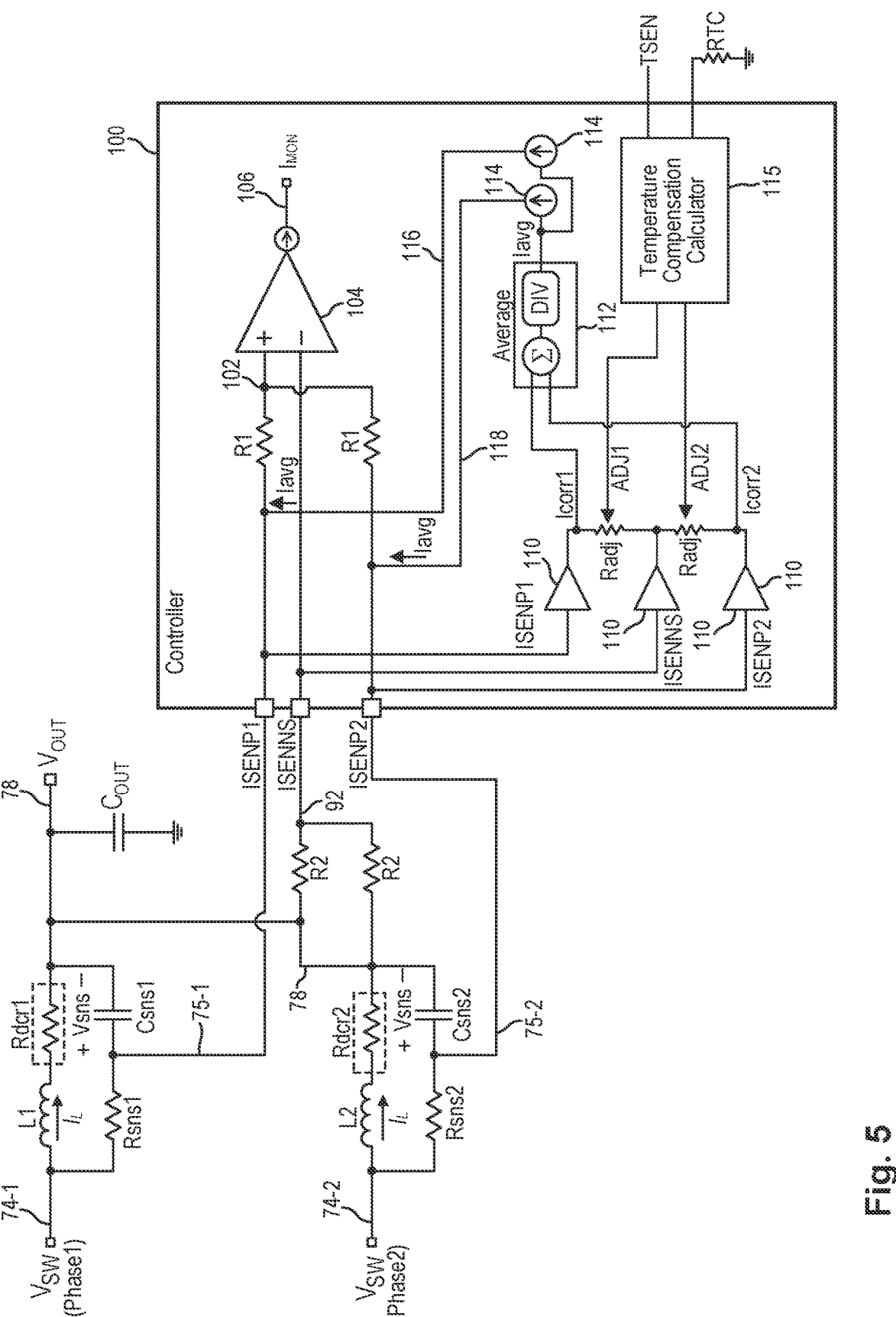
FIG. 5 is a circuit diagram illustrating a temperature compensation circuit implemented for a single-ended DC sensing network in a multiphase switching power supply in embodiments of the present disclosure.

FIG. 5 is a circuit diagram illustrating a temperature compensation circuit implemented for a single-ended DC sensing network in a multiphase switching power supply in embodiments of the present disclosure. Referring to FIG. 5, the temperature compensation circuit is implemented in a controller 100, which can be a multiphase modulator or a PWM controller integrated circuit for a multiphase switching power supply. The controller 100 receives sense signals from a single-ended DC sensing network to measure the load current being provided by the multiphase switching power supply. The temperature compensation circuit of the present invention is implemented in the controller 100 to provides temperature compensation to the sense signals measuring the inductor currents for all phases which is indicative of the load current of the multiphase switching power supply.

In the embodiment shown in FIG. 5, the temperature compensation circuit is applied to a multiphase switching power supply having 2 phases-Phase 1 and Phase 2. For simplicity of discussion, the switching power supply circuitry is not shown and the two phases are represented by the switching output signals $V_{SW}$ for each phase coupled to respective inductor L1 and L2 at the respective switching output nodes 74-1 and 74-2. The inductors are connected to the output voltage node 78 to which the output capacitor $C_{OUT}$ is coupled. An output voltage $V_{OUT}$ of the multiphase switching power supply having a substantially constant magnitude is generated at the output voltage node 78.

In embodiments of the present invention, inductor DCR current sensing is applied to sense the inductor current IL flowing through the inductors L1 and L2 in each phase. In each phase, an RC network of serially connected sense resistor Rsns and sense capacitor Csns is connected in parallel with the inductor L and the parasitic resistance Rdcr of the inductor. The voltage Vsns across the sense capacitor Csns is sensed as the sense signal indicative of the inductor current. In particular, the voltage Vsns is sensed by a pair of sense signals including a positive sense signal ISENPn at one plate (node 75-n) of the capacitor Csns and a negative sense signal ISENNn at the other plate (the output voltage node 78) of the capacitor Csns (where "n" denotes the respective phase). More specifically, the inductor current of inductor L1 of Phase 1 is sensed by the capacitor voltage Vsns1 across the sense capacitor Csns1 using sense signals ISENP1 and ISENN1. The inductor current of inductor L2 of Phase 2 is sensed by the capacitor voltage Vsns2 across the sense capacitor Csns2 using sense signals ISENP2 and ISENN2. The temperature coefficient of the inductor DCR (Rdcr) results in the sensed voltage Vsns having a temperature coefficient. For example, the inductor DCR typically has a positive temperature coefficient and the sensed voltage Vsns therefore has a positive temperature coefficient. The sense signals ISENPn and ISENNn, measuring the sensed voltage Vsns, also has the same positive temperature coefficient.

In the present embodiment, the sense signals of all phases of the multiphase switching power supply is measured using a single-ended DCR sensing scheme. Therefore, instead of feeding back all of the positive and negative sense signals, resulting in 2N number of signals for an N-phase switching power supply, the single-ended DCR sensing scheme feeds back one negative sense signal and all of the positive sense signals. In the present embodiment, each negative sense signal ISENNn at node 78 of each sense capacitor Csns is converted to a current signal by a respective resistor R2 and the resulting current signals from all the phases are summed at a summing node 92. The summed negative sense signal ISENNS is the single negative sense signal being fed back to the controller 100. In practice, the single summed negative sense signal ISENNS together with the positive sense signals ISENPn for all the phases are feedback to the controller 100 for current sensing. In the present example, the summed negative sense signal ISENNS and two positive sense signals ISENP1 and ISENP2 are fed back to the controller 100.

At the controller 100, the positive sense signals ISENPn of all the phases are each converted to a current signal by respective resistors R1 and the resulting current signals from all the phases are summed at a summing node 102. The summed positive sense signal (node 102) is provided to a positive input terminal of a current sense amplifier 104. The summed negative sense signal (node 92) is provided to a negative input terminal of the current sense amplifier 104. The current sense amplifier compares the summed positive sense signal and the negative sense signal to generate an output signal on an output node 106 indicative of the sensed voltage values Vsns for all phases, which is indicative of the inductor currents generated by all the phases and thus the load current of the multiphase switching power supply. In the present embodiment, the current sense amplifier 104 is an operational amplifier and the output signal is a current signal Imon indicative of the load current of the multiphase switching power supply.

As described above, as a result of the inductor DCR sensing, the sense signals have a temperature coefficient, such as a positive temperature coefficient, that can affect the accuracy of the measurement. In embodiments of the present invention, a temperature compensation circuit is provided to implement temperature compensation on the sense signals to correct the temperature coefficient of the sense signals resulting from using inductor DCR sensing. In particular, the temperature compensation circuit generates an average correction signal Iavg based on all of the positive sense signals and a temperature correction factor and distributes the average correction signal Iavg to all of the positive sense signals ISENPn. Accordingly, each positive sense signal is temperature compensated to zero temperature coefficient and the compensated or modified positive sense signals of all the phases are then converted to current signals using respective resistors R1 and summed at the summing node 102 to be used by the current sense amplifier 104 for comparison with the summed negative sense signal ISENNS. In the present description, the summed positive sense signal (node 102) is therefore the sum of the modified or compensated positive sense signals of all the phases of the multiphase switching power supply.

Referring still to FIG. 5, the temperature compensation circuit includes a temperature compensation calculator circuit 115 receiving a sense temperature signal TSEN and a precision temperature reference signal as input signals. In embodiments of the present disclosure, the temperature sense signal TSEN measures the temperature of the inductor L. In some embodiments, the temperature sense signal TSEN can be generated by a temperature sensor located close to the inductor L. In one embodiment, the temperature sensor can be implemented using a DrMOS (driver and MOSFET module) placed near the inductor L to generate the temperature sense signal TSEN. Alternately, the temperature sensor can be implemented using a linearized NTC network using a negative temperature coefficient resistor (Rntc) to generate a voltage reference indicative of the sensed temperature. The precision temperature reference signal is generated by a resistor having a predetermined RTC (resistance-temperature-coefficient). The temperature compensation calculator circuit 115 determines a temperature difference between the sense temperature signal TSEN and the temperature reference signal (RTC) and generates a compensation adjust signal ADJ indicative of the temperature difference. In the present embodiment, N number of copies of the compensation adjust signal ADJ are generated (e.g. ADJ1, ADJ2) where all the compensation adjust signals ADJn have the same signal value. Each copy of the compensation adjust signal ADJ is to be applied to the positive phase current to generate respective per-phase correction signal Icorr. That is, the temperature compensation calculator 115 instructs the same temperature compensation through the adjust signal ADJ to all the phases. Correction signal Icorr for each phase is generated as a function of the positive sense signal for that phase and the adjust signal ADJ. Thus, the correction signal Icorr for one phase may be different from the correction signal Icorr for another phase. In the present embodiment, the correction signals are current signals and may be referred to as a correction current in the present description.

The temperature compensation circuit includes a compensating impedance network to generate the correction signals. The compensating impedance network receives the positive sense signals ISENPn and the summed negative sense signal ISENNS. The compensating impedance network generates a correction signal for each phase of the multiphase switching power supply in response to at least the positive sense signal ISENPn for each phase and the compensation adjust signal ADJ. In particular, the compensation adjust signal ADJ modifies the effective impedance as seen by the per-phase positive sense signal ISENPn to generate the correction signal Icorr for that phase having a temperature coefficient opposite to the temperature coefficient of the positive sense signal ISENPn.

In one embodiment, the compensating impedance network includes a set of buffers 110 to receive and buffer the input signals ISENPn and ISENNS. Each buffer 110 receives one of the sense signals. In the present embodiment, a first buffer receives the positive sense signal ISENP1 for phase 1, a second buffer receives the summed negative sense signal ISENNS, and a third buffer receives the positive sense signal ISENP2 for phase 2. A voltage-controlled impedance network is coupled to the output terminals of the set of buffers 110 to generate the correction signals for each phase of the multiphase switching power supply in response to at least the positive sense signal ISENPn for each phase and the compensation adjust signal ADJ. In one embodiment, the voltage-controlled impedance network includes a set of voltage-controlled resistors Radj connected in series between the output terminal of the first buffer to the output terminal of the last buffer. In particular, each voltage-controlled resistors Radj is connected to the output terminals of the buffer receiving a positive sense signal ISENPn and the buffer receiving the summed negative sense signal ISENNS. The voltage-controlled resistors Radj provides an effective impedance value that has a temperature coefficient opposite to the temperature coefficient of the positive sense signals ISENPn. In operation, each copy of the compensation adjust signal ADJ (e.g. ADJ1, ADJ2) is applied to modify the impedance of each voltage-controlled resistor. Accordingly, the effective impedance of each voltage-controlled resistor is modified as a function of the sensed temperature or the temperature difference between the sensed temperature and a reference temperature.

The voltage-controlled impedance network generates a correction signal Icorr for each phase of the multiphase switching power supply. In particular, a correction signal Icorr is generated for each positive sense signal ISENPn. Accordingly, a correction signal Icorr is generated at the output terminal of a buffer receiving the respective positive sense signal ISENPn, where the positive sense signal ISENPn is modified by the impedance of the voltage-controlled resistors Radj, and where the impedance of the voltage-controlled resistors Radj is modified by the adjust signal ADJ as a function of the sensed temperature or sensed temperature difference. In the present example, a first correction signal Icorr1 is generated for the positive sense signal ISENP1 and a second correction signal Icorr2 is generated for the positive sense signal ISENP2.

The correction signals Icorr1 and Icorr2 are then averaged to generate the average correction signal Iavg. For example, an average circuit 112 receives the correction signals Icorr1 and Icorr2. The average circuit 112 sums the correction signals received for all the phases and then divides the correction signals by the number of phases to generate the average correction signal Iavg. The average correction signal Iavg is then duplicated or copied to generate multiple copies of the average correction signal, one copy for each phase of the multiphase switching power supply. In the present embodiment, the correction signal is a correction current signal and the average correction signal is also an average correction current signal. The average correction current signal Iavg is duplicated through the use of current mirrors 114 or other suitable circuits to generate multiple copies of the correction current signal Iavg. In another embodiment, the output stage of the average circuit 112 may be duplicated to generate the multiple copies of the average correction signal Iavg.

The copies of the average correction signal are applied to the positive sense signals ISENPn to correct the temperature coefficient of the sense signals. In particular, each copy of the average correction signal is fed or applied to a respective positive sense signal ISENPn to generate a modified or compensated positive sense signal with zero or substantially zero temperature coefficient. In the present embodiment, the positive sense signal is compensated by an average correction signal. For some of the phases, the positive sense signal may be undercompensated, while for other phases, the positive sense signal may be overcompensated. However, high compensation accuracy can be achieved over all of the phases and over many switching cycles.

With the positive sense signals ISENPn thus compensated, the amplifier 104 generates the output signal Imon indicative of the load current of the switching power supply where the output signal Imon has substantially zero temperature coefficient over a wide frequency range.

Figure 6:
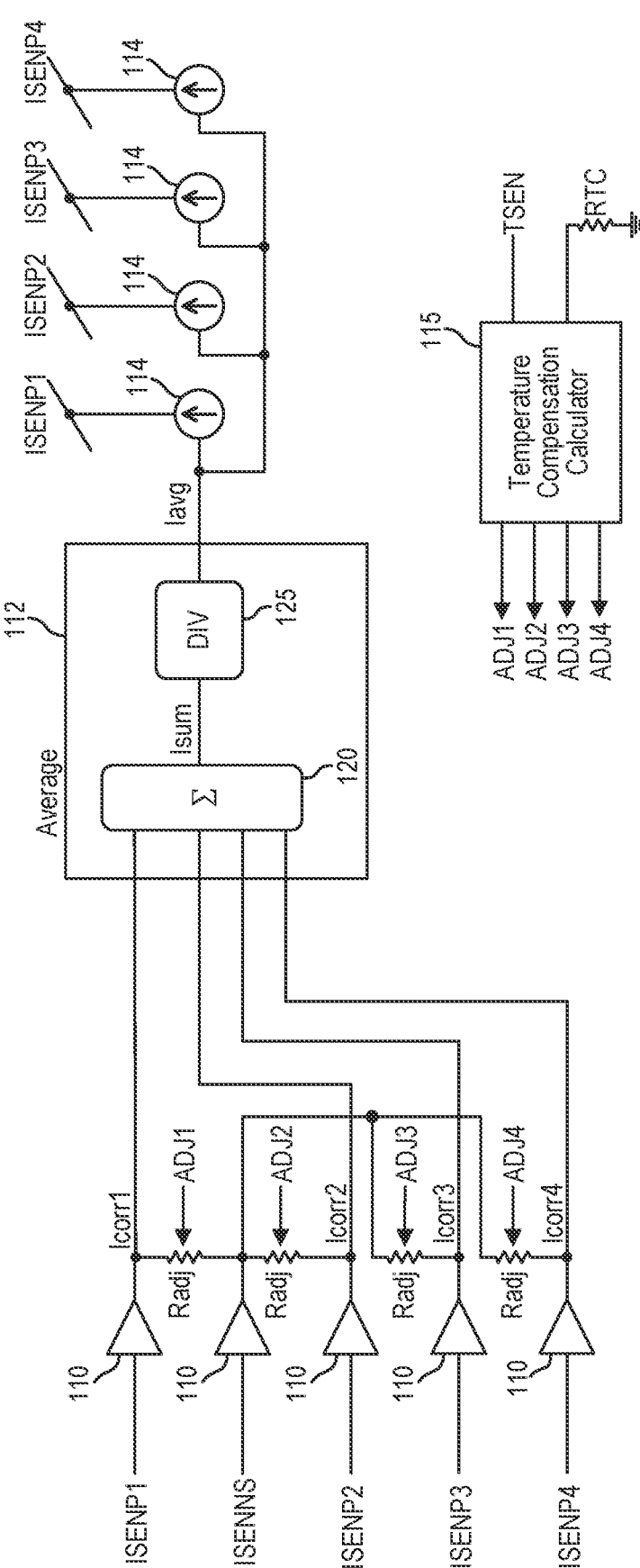
FIG. 6 is a circuit diagram illustrating a temperature compensation circuit implemented for a single-ended DC sensing network in a multiphase switching power supply in embodiments of the present disclosure.

FIG. 6 is a circuit diagram illustrating a temperature compensation circuit implemented for a single-ended DC sensing network in a multiphase switching power supply in embodiments of the present disclosure. In particular, FIG. 6 illustrates the implementation of the temperature compensation circuit of FIG. 5 for more than 2 phases. Like elements in FIGS. 5 and 6 are given like reference numerals to simplify the discussion. Referring to FIG. 6, in the case the multiphase switching power supply has 3 or more phases, the compensating impedance network is expanded to include additional buffers 110 to receive the positive sense signals ISENPn for all the phases. The voltage-controlled impedance network is also expanded to include additional voltage-controlled resistors Radj coupled to the output terminals of the respective buffers receiving the positive sense signals ISENPn. More specifically, each voltage-controlled resistors Radj is connected to the output terminals of the buffer receiving a positive sense signal ISENPn and the buffer receiving the summed negative sense signal ISENNS. The voltage-controlled resistors Radj provides an effective impedance value that has a temperature coefficient opposite to the temperature coefficient of the positive sense signals ISENPn. In operation, each copy of the compensation adjust signal ADJ (e.g. ADJ1, ADJ2) is applied to modify the impedance of each voltage-controlled resistor Radj.

A correction signal Icorr is generated for each positive sense signal ISENPn. Accordingly, a correction signal Icorr is generated at the output terminal of a buffer receiving the respective positive sense signal ISENPn. In the example shown in FIG. 6, correction signals Icorr1, Icorr2, Icorr3 and Icorr4 are generated by the compensating impedance network. All four correction signals are provided to the average circuit 112 to be summed by a summer 120 to generate a summed signal Isum. The summed signal Isum is then divided by the number of phases (i.e. 4) by the divider 125 to generate the average correction signal Iavg. The average correction signal Iavg is duplicated, such as by current mirrors 114, to generate copies of the average correction signal Iavg. Each copy of the average correction signal Iavg is applied to a respective positive sense signal ISENPn to compensate for the temperature coefficient of the sense signal.

Figure 7:
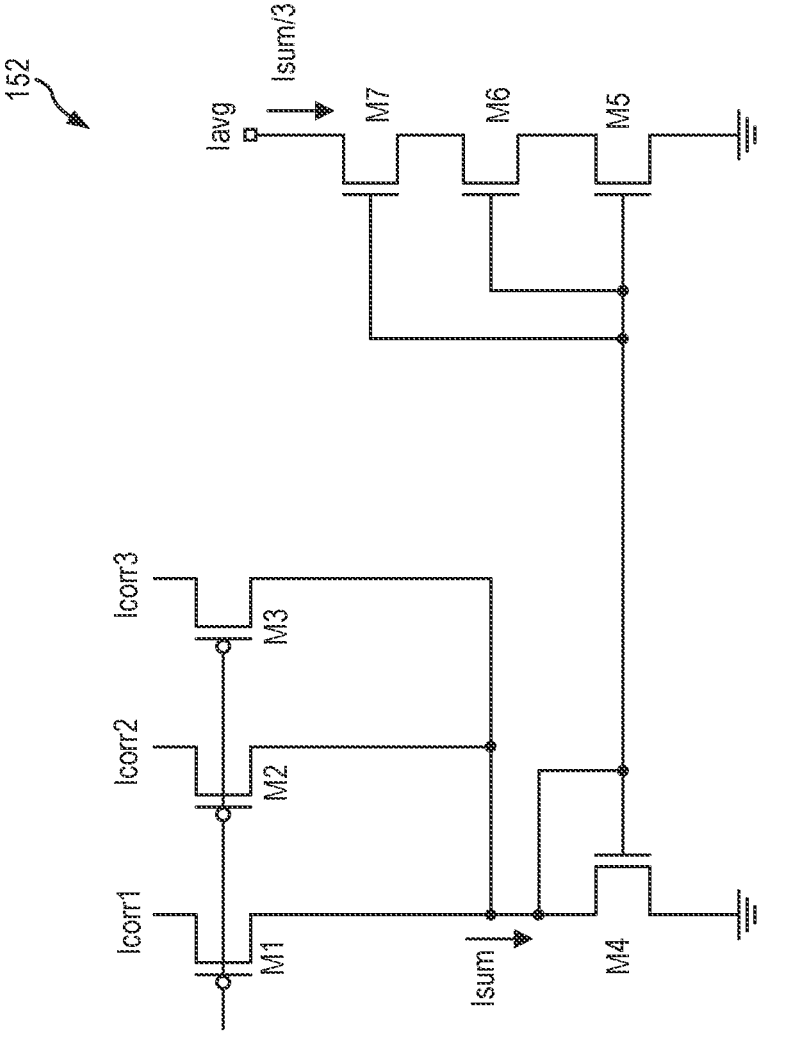
FIG. 7 is a circuit diagram of an average circuit in some embodiments.

FIG. 7 is a circuit diagram of an average circuit in some embodiments. Referring to FIG. 7, in the case the correction signals are correction current signals, an average circuit 152 can be implemented as a current summer using PMOS transistors (e.g. M1, M2 and M3) to sum the correction current signals (e.g. Icorr1, Icorr2, Icorr3). The summed current signal Isum is then coupled to a current mirror formed by NMOS transistors M4 and M5. The summed current is divided down by serially connecting NMOS transistors to the current mirror. To divide the summed current by 3, NMOS transistors M6 and M7 are connected in series with transistor M5. In this manner, the average correction current Iavg is generated at the drain terminal of transistor M7. The average correction current Iavg can then be copied or duplicated using additional current mirrors.

FIG. 8 is a flowchart illustrating a method of providing temperature compensation to sense signals in a single-ended DC resistance (DCR) sensing network for a multiphase switching power supply in some embodiments. Referring to FIG. 8, a method 200 provides temperature compensation to sense signals in a single-ended DC resistance (DCR) sensing network for a multiphase switching power supply, where an inductor current in each phase of the multiphase switching power supply is sensed by a resistor-capacitor (RC) network connected in parallel to the inductor of the respective phase. A voltage across the capacitor of the RC network is provided as sense signals indicative of the inductor current, where the sense signals include a positive sense signal and a negative sense signal and having a first temperature coefficient.

The method 200 receives a temperature sense signal indicative of a temperature associated with the sense signals (202). The method 200 generates a compensation adjust signal in response to a difference between the temperature sense signal and a reference temperature signal (204). The method then generates a correction signal for each phase of the multiphase switching power supply in response to at least the positive sense signal for the respective phase and the compensation adjust signal, where the correction signal for each phase has a second temperature coefficient (206). The method 200 then generates an average correction signal indicative of an average of the correction signals of all phases of the multiphase switching power supply (208).

The method 200 then applies the average correction signal to each of the positive sense signals to generate a modified positive sense signal for each phase having substantially zero temperature coefficient over a first frequency range (210). The method 200 generates a summed positive sense signal being the sum of the modified positive sense signals of all the phases and a summed negative sense signal being the sum of the negative sense signals of all the phases of the multiphase switching power supply (212). Finally, the method 200 generates an output signal indicative of the difference between the summed positive sense signal and the summed negative sense signal, where the output signal has substantially zero temperature coefficient over the first frequency range.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A circuit for providing temperature compensation to sense signals in a single-ended DC resistance (DCR) sensing network for a multiphase switching power supply, wherein an inductor current in each phase of the multiphase switching power supply is sensed by a resistor-capacitor (RC) network connected in parallel to the inductor of the respective phase and a voltage across the capacitor of the RC network is provided as sense signals indicative of the inductor current, the sense signals including a positive sense signal and a negative sense signal and having a first temperature coefficient, the circuit comprising:

a temperature compensation calculator circuit receiving a temperature sense signal indicative of a temperature associated with the sense signals and a reference temperature signal and generating a compensation adjust signal in response to a difference between the temperature sense signal and the reference temperature signal;

a compensating impedance network receiving the positive sense signals for all the phases of the multiphase switching power supply, a summed negative sense signal being the sum of the negative sense signals of all the phases of the multiphase switching power supply and the compensation adjust signal, the compensating impedance network generating a correction signal for each phase of the multiphase switching power supply in response to at least the positive sense signal for each phase and the compensation adjust signal, the correction signal for each phase having a second temperature coefficient;

an average circuit coupled to average the correction signals associated with all the phases of the multiphase switching power supply to generate an average correction signal, the average correction signal or copies of the average correction signal being applied to modify each of the positive sense signals to provide a modified positive sense signal for each phase having substantially zero temperature coefficient over a first frequency range; and an amplifier circuit receiving a summed positive sense signal being the sum of the modified positive sense signals for all the phases and the summed negative sense signal, the amplifier circuit generating an output signal indicative of the difference between the summed positive sense signal and the summed negative sense signal, the output signal having substantially zero temperature coefficient over the first frequency range.

2. The circuit of claim 1, wherein the compensating impedance network comprises:

a plurality of buffers, a first buffer of the plurality of buffers receiving the summed negative sense signal, each of the remaining buffers receiving a respective positive sense signal for each phase of the multiphase switching power supply, the buffers providing respective sense signals at respective output terminals; and a voltage-controlled impedance network coupled to the output terminals of the plurality of buffers, the voltage-controlled impedance network providing the correction signals having the second temperature coefficient for each phase of the multiphase switching power supply in response to at least the positive sense signal for each phase and the compensation adjust signal.

3. The circuit of claim 2, wherein the voltage-controlled impedance network comprises a plurality of voltage-controlled resistors having the second temperature coefficient, each voltage-controlled resistor being coupled between an output terminal of the first buffer and an output terminal of a buffer receiving a respective positive sense signal for each phase of the multiphase switching power supply, the impedance of each voltage-controlled resistor being modified in response to the compensation adjust signal.

4. The circuit of claim 3, wherein the modified impedance of each voltage-controlled resistor comprises a positive impedance value or a negative impedance value.

5. The circuit of claim 3, wherein the correction signals comprises correction current signals and the modified impedance of each voltage-controlled resistor is applied to modify the positive sense signal of each phase received by a respective buffer to generate the respective correction current signal for that phase.

6. The circuit of claim 5, wherein the correction current for each phase is generated at the output terminal of the buffer receiving the positive sense signal of the respective phase.

7. The circuit of claim 1, wherein the average circuit comprises:

a summing circuit coupled to receive the correction signals associated with all phases of the multiphase switching power supply and to generate a summed signal being the sum of the correction signals of all the phases; and a divider circuit coupled to receive the summed signal and to divide the summed signal by a number of phases of the multiphase switching power supply to generate the average correction signal.

8. The circuit of claim 1, wherein the correction signals comprise correction current signals and the average correction signal comprises an average correction current signal, and the average circuit further comprises a plurality of current mirrors to generate copies of the average correction current signal to be applied to modify each of the respective positive sense signals.

9. The circuit of claim 1, wherein the first frequency range comprises a frequency range from DC to 10 MHz.

10. The circuit of claim 1, wherein the amplifier circuit comprises a positive input terminal coupled to receive the summed positive sense signal and a negative input terminal coupled to receive the summed negative sense signal, the amplifier circuit having an output terminal providing the output signal indicative of the difference between the summed positive sense signal and the summed negative sense signal, the correction signals being applied to the respective positive sense signals of the respective phases to generate the modified positive sense signals which are summed at the positive input terminal of the amplifier circuit.

11. The circuit of claim 10, wherein the amplifier circuit comprises an operational amplifier circuit, the summed positive sense signal and the summed negative sense signal comprise current signals and having the first temperature coefficient, the output signal comprises a voltage or current signal indicative of the difference between the summed positive sense signal and the summed negative sense signal and having substantially zero temperature coefficient over the first frequency range.

12. The circuit of claim 1, wherein the summed positive sense signal is generated by coupling the modified positive sense signal of each phase to a first terminal of a respective first resistor and connecting the second terminals of the first resistors of all the phases together to provide the summed positive sense signal; and the summed negative sense signal is generated by coupling the negative sense signal of each phase to a first terminal of a respective second resistor and connecting the second terminals of the second resistors of all the phases together to provide the summed negative sense signal.

13. A method of providing temperature compensation to sense signals in a single-ended DC resistance (DCR) sensing network for a multiphase switching power supply, wherein an inductor current in each phase of the multiphase switching power supply is sensed by a resistor-capacitor (RC) network connected in parallel to the inductor of the respective phase and a voltage across the capacitor of the RC network is provided as sense signals indicative of the inductor current, the sense signals including a positive sense signal and a negative sense signal and having a first temperature coefficient, the method comprising:

receiving a temperature sense signal indicative of a temperature associated with the sense signals;

generating a compensation adjust signal in response to a difference between the temperature sense signal and a reference temperature signal;

generating a correction signal for each phase of the multiphase switching power supply in response to at least the positive sense signal for the respective phase and the compensation adjust signal, the correction signal for each phase having a second temperature coefficient;

generating an average correction signal indicative of an average of the correction signals of all phases of the multiphase switching power supply;

applying the average correction signal to each of the positive sense signals to generate a modified positive sense signal for each phase having substantially zero temperature coefficient over a first frequency range;

generating a summed positive sense signal being the sum of the modified positive sense signals of all the phases and a summed negative sense signal being the sum of the negative sense signals of all the phases of the multiphase switching power supply; and generating an output signal indicative of the difference between the summed positive sense signal and the summed negative sense signal, the output signal having substantially zero temperature coefficient over the first frequency range.

14. The method of claim 13, wherein generating the correction signal for each phase of the multiphase switching power supply in response to at least the positive sense signal for the respective phase and the compensation adjust signal comprises:

receiving at a first buffer the summed negative sense signal and receiving at a plurality of buffers the positive sense signals of all phases of the multiphase switching power supply; and generating at output terminals of the plurality of buffers the correction signals having the second temperature coefficient for each phase of the multiphase switching power supply in response to at least the positive sense signal for each phase and the compensation adjust signal.

15. The method of claim 14, wherein generating at output terminals of the plurality of buffers the correction signals having the second temperature coefficient for each phase of the multiphase switching power supply comprises:

coupling a plurality of voltage-controlled resistors having the second temperature coefficient to the output terminals of the first buffer and the plurality of buffers, each voltage-controlled resistor being coupled between the output terminal of the first buffer and the output terminal of a respective one of the plurality of buffers;

modifying an impedance of each voltage-controlled resistor in response to the compensation adjust signal; and generating the correction current for each phase at the output terminal of a respective buffer receiving the positive sense signal of the respective phase in response to the modified impedance of the voltage-controlled resistor coupled thereto.

16. The method of claim 15, wherein the modifying an impedance of each voltage-controlled resistor in response to the compensation adjust signal comprises:

modifying an impedance of each voltage-controlled resistor in response to the compensation adjust signal.

17. The method of claim 13, wherein the correction signals comprise correction current signals and the average correction signal comprises an average correction current signal, and applying the average correction signal to each of the positive sense signals to generate the modified positive sense signal for each phase comprises:

generating copies of the average correction current signal; and applying each copy of the average correction current signal to a respective positive sense signal to generate the modified positive sense signal for each phase.

18. The method of claim 13, wherein applying the average correction signal to each of the positive sense signals to generate the modified positive sense signal for each phase having substantially zero temperature coefficient over a first frequency range comprises:

applying the average correction signal to each of the positive sense signals to generate the modified positive sense signal for each phase having substantially zero temperature coefficient over a frequency range from DC to 10 MHz.

19. The method of claim 13, wherein generating the summed positive sense signal and the summed negative sense signal comprises:

generating the summed positive sense signal by coupling the modified positive sense signal of each phase to a first terminal of a respective first resistor and connecting the second terminals of the first resistors of all the phases together to provide the summed positive sense signal; and generating the summed negative sense signal by coupling the negative sense signal of each phase to a first terminal of a respective second resistor and connecting the second terminals of the second resistors of all the phases together to provide the summed negative sense signal.

20. The method of claim 13, wherein generating the output signal indicative of the difference between the summed positive sense signal and the summed negative sense signal comprises:

coupling the summed positive sense signal to a positive input terminal of an operational amplifier circuit;

coupling the summed negative sense signal to a negative input terminal of the operational amplifier circuit; and generating the output signal at an output terminal of the operational amplifier circuit, the output signal comprising a voltage or current signal indicative of the difference between the summed positive sense signal and the summed negative sense signal and having substantially zero temperature coefficient over the first frequency range.

\* \* \* \* \*